United States Patent [19]
Mori et al.

[11] Patent Number: 5,434,365
[45] Date of Patent: Jul. 18, 1995

[54] SUPPORTING STRUCTURE FOR A VIBRATOR

[75] Inventors: Akira Mori; Takeshi Nakamura; Yoshiaki Heinouchi, all of Nagaokakyo, Japan

[73] Assignee: Murata Manufacturing Co., Ltd., Kyoto, Japan

[21] Appl. No.: 9,095

[22] Filed: Jan. 26, 1993

[30] Foreign Application Priority Data

Jan. 28, 1992 [JP] Japan ................................. 4-038654

[51] Int. Cl.⁶ ............................................. H05R 1/00
[52] U.S. Cl. ................................... 174/262; 174/250; 174/263; 174/266
[58] Field of Search ............... 174/250, 260, 262, 263, 174/266; 361/760; 356/388

[56] References Cited
U.S. PATENT DOCUMENTS 3,991,347 11/1976 Hollyday .
4,894,271 1/1990 Hani et al. .

*Primary Examiner*—Leo P. Picard
*Assistant Examiner*—Cheryl R. Figlin
*Attorney, Agent, or Firm*—Nikaido, Marmelstein, Murray & Oram

[57] ABSTRACT

In a mounting board, two through-holes are formed which are used for inserting both ends of a supporting member for a vibrator. On a surface of the mounting board, a ground conductor pattern is formed. In the ground conductor pattern, two portions of arcs, where the ground conductor pattern is removed, are formed on respective peripheries of the two through-holes. Furthermore, on the mounting board, two connecting conductor patterns are formed on surfaces of portions defined by the two through-holes and so on, so as to extend from the ground conductor pattern. Both ends of the supporting member for the vibrator are respectively inserted into the two through-holes and soldered to two connecting conductor patterns.

4 Claims, 3 Drawing Sheets

SUPPORTING STRUCTURE FOR A VIBRATOR

BACKGROUND OF THE INVENTION

1. Field of the Invention

The present invention relates to a supporting structure for a vibrator and, more particularly, to a supporting structure for a vibrator having a bending vibration mode which is used for a vibratory gyroscope or the like.

2. Description of the Prior Art

FIG. 5 is a side illustrative view showing an example of a conventional vibratory gyroscope which is a background of the present invention, FIG. 6 is a front illustrative view thereof, and FIG. 7 is a bottom view showing an essential portion thereof. The vibratory gyroscope 1 comprises a triangular prism-shaped vibrator 2, and two supporting members 3a and 3b made of wire rods are respectively secured to the vicinity of nodal points of the vibrator 2.

Both ends of one supporting member 3a are fixed to one mounting board 4a by soldering. In this case, in the mounting board 4a, two through-holes 5a are formed so as to leave a distance similar to a distance between both ends of the supporting member 3a. On almost the whole bottom face of the mounting board 4a, a ground conductor pattern 6a of copper foil for shielding is formed. On the mounting board 4a, connecting conductor patterns 7a are respectively formed on surfaces of portions defined by the through-holes 5a and surfaces of portions surrounded the through-holes 5a, so as to extend from the ground conductor pattern 6a. Both ends of the supporting member 3a are respectively inserted into the through-holes 5a of the mounting board 4a and soldered to the connecting conductor patterns 7a.

Similarly, both ends of the other supporting member 3b are respectively inserted into through-holes 5b of the other mounting board 4b having the same structure as one mounting board 4a, and soldered to connecting conductor patterns 7b extending from a ground conductor pattern 6b for shielding.

In addition, these mounting boards 4a and 4b are respectively bonded to a supporting base (not shown) such as a work plate via a cushioning material (not shown).

In the vibratory gyroscope 1 shown in FIGS. 5–7, though two supporting members 3a and 3b bend in opposite directions simultaneously with the vibration of the vibrator 2, these supporting members 3a and 3b scarcely interfere with each other, since these supporting members 3a and 3b are bonded to the supporting base via the cushioning material. Therefore, the vibration of the vibrator 2 is little suppressed by the supporting members 3a and 3b, and maintaining stable vibration of the vibrator 2 can be expected.

However, in the conventional supporting structure for the vibrator, when both ends of the supporting member are soldered to the connecting conductor patterns on the mounting board, an amount of heat which is released to the ground conductor pattern is large, and thus it sometimes occurs that solder cools at midway points of the through-holes in the mounting board to solidify and does not fill up the through-holes. If solder is not filled up in the through-holes of the mounting board, it becomes impossible to fix the supporting member to the mounting board with sufficient strength. Furthermore, if amounts of solder filling in the through-holes of the mounting board vary at every holes, this causes variations in vibrator characteristics.

SUMMARY OF THE INVENTION

It is therefore a primary object of the present invention to provide a supporting structure for a vibrator in which solder can be easily filled up in a through-hole of a mounting board into which a supporting member is inserted.

The present invention is a supporting structure for a vibrator wherein the vibrator provided with a supporting member is supported, comprises a mounting board having a through-hole for inserting the supporting member, a ground conductor pattern formed on a main surface of the mounting board, and a connecting conductor pattern, extended from the ground conductor pattern, formed on a surface of a portion of the mounting board defined by the through-hole, the supporting member is soldered thereto, wherein a suppressed heat release portion, where the ground conductor pattern is removed, is provided on a periphery of the through-hole.

When the supporting member is soldered to the connecting conductor pattern, the suppressed heat release portion, where the ground conductor pattern is removed, acts to suppress heat released to the ground conductor pattern. Therefore, solder supplied does not cool to solidify before it is fills up in the through-hole, and the solder easily fills up the through-hole of the mounting board.

According to the present invention, a supporting structure for a vibrator can be obtained wherein solder can be easy filled up in a through-hole of a mounting board into which a supporting member is inserted. Therefore, it is easily to fix the supporting member to the mounting board with sufficient strength. Furthermore, it is easy to equalize an amount of solder supplied to the through-hole of the mounting board, as well as to reduce variations of the vibrator characteristics.

The above and other objects, features, aspects and advantages of the present invention will become more apparent from the following detailed description of the embodiments with reference to the accompanying drawings.

DESCRIPTION OF THE PREFERRED EMBODIMENTS

Figure 1:
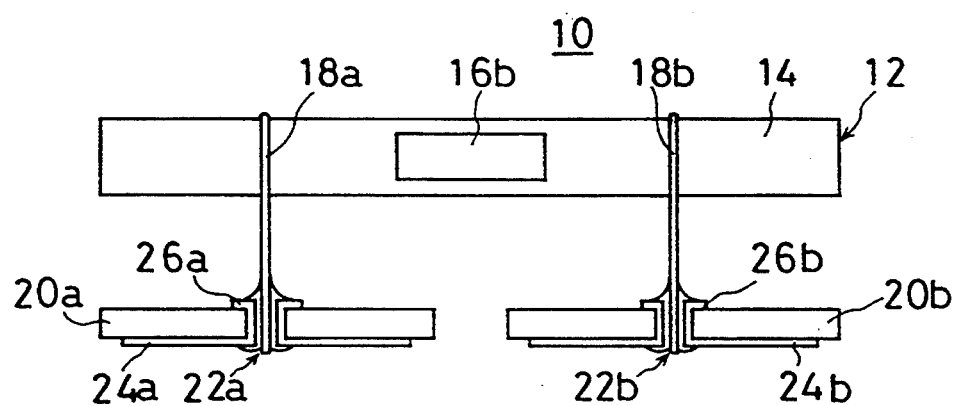
FIG. 1 is a side illustrative view showing one embodiment of the present invention.
Figure 2A:
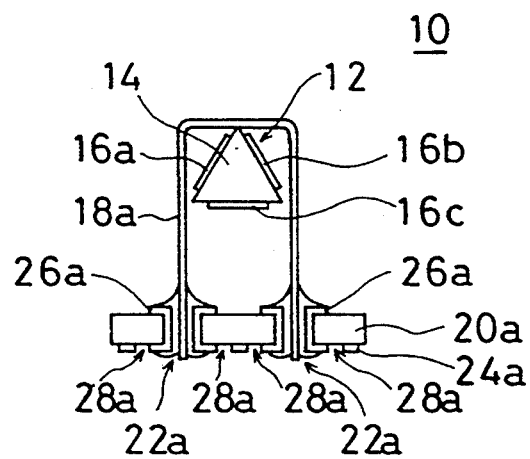
FIG. 2(A) is a front illustrative view showing the embodiment of FIG. 1.
Figure 2B:
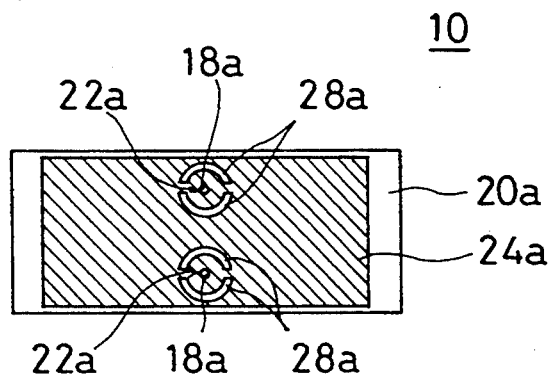
FIG. 2(B) is a bottom view showing an essential portion of the embodiment of FIG. 1.

FIG. 1 is a side illustrative view showing one embodiment of the present invention, FIG. 2(A) is a front illustrative view thereof, and FIG. 2(B) is a bottom view showing an essential portion thereof. Though the present invention relates to a supporting structure of a vibrator, in the embodiment, a vibratory gyroscope using a vibrator will be explained.

The vibratory gyroscope 10 comprises a vibrator 12, and the vibrator 12 includes, for example, a regular triangular prism-shaped vibrating body 14. The vibrating body 14 is made of a material, which generates generally a mechanical vibration, such as elinver, Fe-Ni alloy, quartz, glass, crystal or ceramic.

In the centers of the three side faces of the vibrating body 14, piezoelectric elements 16a, 16b and 16c are respectively formed. Assuming that the longitudinal length of the vibrating body 14 is L, at two points, for example, 0.224L inwardly apart from each end of the vibrating body 14, on a ridgeline between the side faces on which the piezoelectric elements 16a and 16b are formed, center portions of U-shaped supporting members 18a and 18b made of, for example, wire rods are respectively fixed to the vibrating body 14 by, for example, welding or bonding.

In the vibrator 12, when a driving signal is applied to the piezoelectric elements 16a and 16b or to the piezoelectric element 16c, the vibrating body 14 vibrates in a direction orthogonal to the main surface of the the piezoelectric element 16c. In this case, assuming that the longitudinal length of the vibrating body 14 is L, nodal points of the vibrator 12 are at two points, respectively 0.224L inwardly apart from each end of the vibrating body 14, on the center axis of the vibrating body 14. Therefore, two supporting members 18a and 18b bend in opposite directions on the axis of the vibrating body 14.

Both ends of one supporting member 18a are fixed to one mounting board 20a made of, for example, insulating material such as ceramic.

As particularly shown in FIG. 2(B), in the center of the length of the mounting board 20a, two circular through-holes 22a are formed so as to leave a distance similar to a distance between both ends of the supporting member 18a.

On almost the whole bottom surface of the mounting board 20a, a ground conductor pattern 24a for shielding is formed which is made of, for example, copper foil. Furthermore, on the mounting board 20a, two connecting conductor patterns 26a are formed on surfaces of portions defined by the through-holes 22a and surfaces of portions surrounding the through-holes 22a so as to extend from the ground conductor pattern 24a.

The ground conductor pattern 24a, has two portions 28a of, for example, arcs where the ground conductor pattern 24a is removed, which are formed to leave a distance on peripheries of one through-hole 22a, and similarly two portions 28a of, for example, arcs where the ground conductor pattern 24a is removed, are formed on peripheries of the other through-hole 22a.

Both ends of the supporting member 18a are respectively inserted into two through-holes 22a of the mounting board 20a and soldered to two connecting conductor patterns 26a. In this case, heat released to the ground conductor pattern 24a can be suppressed by the portions 28a where the ground conductor pattern 24a is removed. Thereby, the solder supplied is not rapidly cooled to solidify, and the solder can be easily filled in the through-holes 22a of the mounting board 20a.

Similarly, both ends of the other supporting member 18b are also fixed to the other mounting board 20b having the same structure as the above mounting board 20a. That is, in the mounting board 20b, two through-holes 22b are also formed in the center of the length thereof. On the almost whole bottom surface of the mounting board 20b, a ground conductor pattern 24b for shielding is formed. Furthermore, on the mounting board 20b, two connecting conductor patterns 26b are formed on surfaces of portions defined by the two through-holes 22b and surfaces of portions surrounding the through-holes 22b so as to extend from the ground conductor pattern 24b. On the ground conductor pattern 24b, two portions 28b, of arcs where the ground conductor pattern 24b is removed, are formed on respective peripheries of the through-holes 22b. Both ends of the supporting member 18b are respectively inserted into the two through-holes 22b of the mounting board 20b and soldered to the two connecting conductor patterns 26b. Therefore, solder can be easily filled up in the through-holes 22b of the mounting board 20b.

In addition, these mounting boards 20a and 20b are bonded with adhesive to a supporting base such as a work plate made of, for example, metal or ceramic via a cushioning material like a silicone rubber sheet or a foaming sheet of silicone resin.

In the embodiment, when a driving signal is applied to the piezoelectric element 16a and 16b or to the piezoelectric element 16c, the vibrator 12 vibrates. In this case, though the supporting members 18a and 18b bend in opposite directions on the longitudinal axis of the vibrating body 14, and simultaneously the two mounting boards 20a and 20b are separately displaced. Thus, the supporting members 18a and 18b do not interfere with each other, and the vibration of the vibrator 12 is not suppressed by the supporting members 18a and 18b. Therefore, it is possible to secure stable vibration of the vibrator 12.

Furthermore, in the embodiment, it is possible to easily fill up the through-holes 22a and 22b of the mounting boards 20a and 20b with solder, and thus it is easy to fix the supporting members 18a and 18b to the mounting boards 20a and 20b respectively with sufficient strength, to equalize amounts of solder filled into these through-holes, and to suppress characteristic variations of the vibrator 12.

Furthermore, in the embodiment, the mounting boards 20a and 20b are fixed to the supporting base via the cushioning material, and thus the system scarcely suffers a bad effect of external vibration noise.

In addition, though a regular triangular prism-shaped vibrating body is used as a vibrating body of a vibrator in the above embodiment, a vibrating body having another shape such as a square prism may be used.

Figure 3:
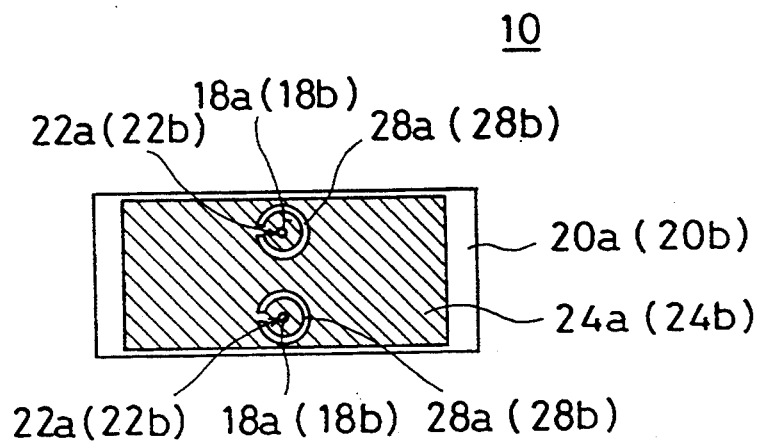
FIG. 3 is a bottom view showing an essential portion of another embodiment of the present invention.
Figure 4:
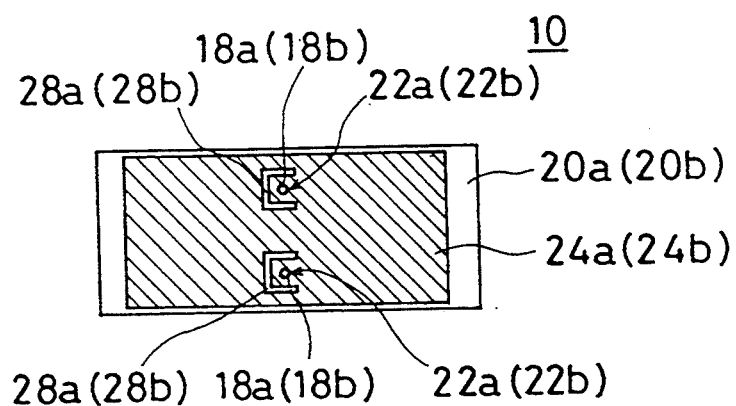
FIG. 4 is a bottom view showing an essential portion of still another embodiment of the present invention.
Figure 5:
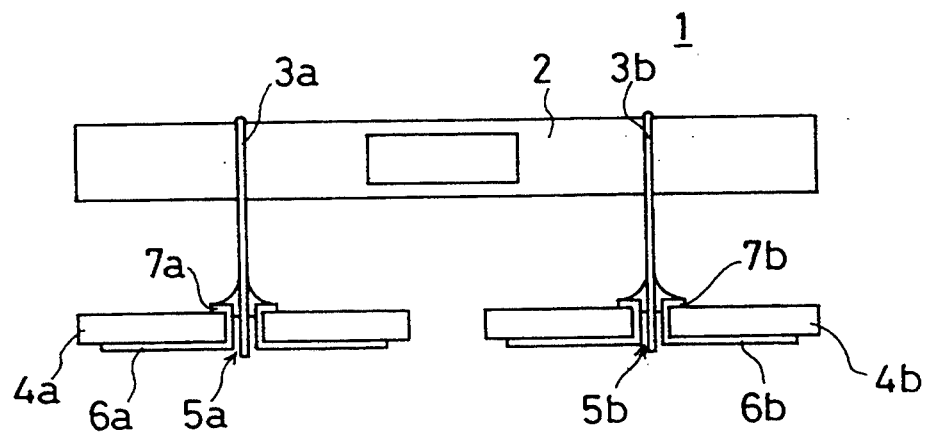
FIG. 5 is a side illustrative view showing an example of a conventional vibratory gyroscope which is a background of the present invention.
Figure 6:
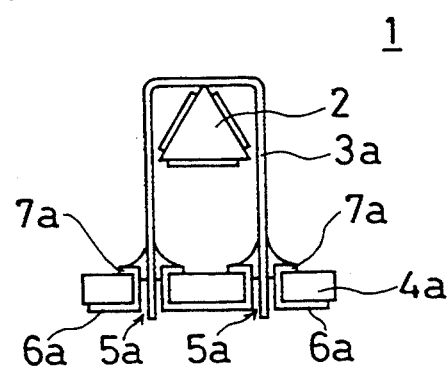
FIG. 6 a front illustrative view showing the vibratory gyroscope of FIG. 5.
Figure 7:
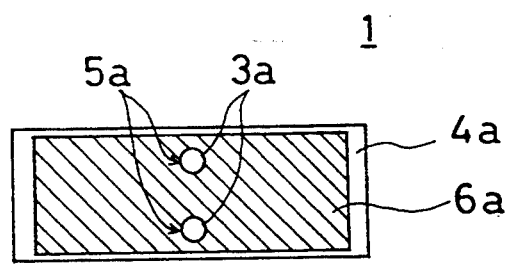
FIG. 7 is a bottom view showing an essential portion of the vibratory gyroscope of FIG. 5.

Though two portions of arcs where the ground conductor pattern is removed, are formed on the peripheries of one through-hole in the above embodiment, as shown in FIG. 3, an approximate C-shaped portion 28a (28b) that the ground conductor pattern 24a (24b) on the mounting board 20a (20b) may be formed, or as shown in FIG. 4, an approximate U-shaped portion 28a (28b) that the ground conductor pattern 24a (24b) on the mounting board 20a (20b) may be formed, respectively, on the periphery of the through-hole 22a (22b), and a shape of a portion that the ground conductor pattern is removed may be arbitrarily changed.

Furthermore, though the ground conductor pattern is formed on the bottom face of the mounting board in the above embodiment, the ground conductor pattern may be formed on the top face of the mounting board.

It will be apparent from the foregoing that, while the present invention has been described in detail and illustrated, these are only particular illustrations and examples and the invention is not limited to these. The spirit and scope of the invention is limited only by the appended claims.

What is claimed is:

1. A supporting structure for a vibrator wherein the vibrator, provided with a supporting member, is supported, comprising:
   a mounting board having first and second surfaces and having a through-hole for inserting said supporting member;
   a ground conductor pattern formed on said first surface of said mounting board; and
   a connecting conductor pattern extended from said ground conductor pattern on said first surface and formed on said second surface of a portion of said mounting board defined by said through-hole and said connecting conductor portion surrounding said through-hole, said supporting member is soldered to said connecting conductor pattern,
   wherein a suppressed heat release portion, where said ground conductor pattern is removed, is provided to partially surround a periphery of said through-hole, said suppressed heat release portion for suppression of heat released when solder is applied to said supporting member.

2. A supporting structure for a vibrator according to claim 1, wherein said suppressed heat release portion is formed in an arc.

3. A supporting structure for a vibrator according to claim 1, wherein said suppressed heat release portion is formed in an approximate C-shape.

4. A supporting structure for a vibrator according to claim 1, wherein said suppressed heat release portion is formed in an approximate U-shape.

* * * * *